(12) United States Patent
Blanco, Jr.

(10) Patent No.: US 8,215,012 B2
(45) Date of Patent: Jul. 10, 2012

(54) THERMAL CONTACT ARRANGEMENT

(75) Inventor: Richard Lidio Blanco, Jr., Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 264 days.

(21) Appl. No.: 12/244,192

(22) Filed: Oct. 2, 2008

(65) Prior Publication Data

US 2009/0044407 A1     Feb. 19, 2009

Related U.S. Application Data

(62) Division of application No. 11/241,061, filed on Sep. 30, 2005, now Pat. No. 7,433,191.

(51) Int. Cl.
  *H01R 43/00*   (2006.01)
  *H05K 13/00*   (2006.01)
  *H05K 3/36*    (2006.01)
  *H05K 3/20*    (2006.01)

(52) U.S. Cl. ............... 29/854; 29/830; 29/831

(58) Field of Classification Search .............. 29/854, 29/830, 831; 361/704; 165/80.3, 185; 257/706, 257/712

See application file for complete search history.

(56) References Cited

U.S. PATENT DOCUMENTS

| | | |
|---|---|---|
| 4,104,523 A | 8/1978 | Wolfert |
| 4,614,528 A | 9/1986 | Lennen |
| 4,620,248 A | 10/1986 | Gitzendanner |
| 4,863,499 A | 9/1989 | Osendorf |
| 4,982,783 A | 1/1991 | Fickett et al. |
| 5,025,336 A | 6/1991 | Morehouse et al. |
| 5,148,337 A | 9/1992 | Cullen et al. |
| 5,392,177 A | 2/1995 | Chainer et al. |
| 5,440,172 A | 8/1995 | Sutrina |
| 5,781,768 A | 7/1998 | Jones, Jr. |
| 5,905,636 A | 5/1999 | Baska et al. |
| 6,076,171 A | 6/2000 | Kawata |
| 6,143,058 A | 11/2000 | Dahlgren et al. |
| 6,243,656 B1 | 6/2001 | Arai et al. |
| 6,286,212 B1 | 9/2001 | Eaton |
| 6,407,595 B1 | 6/2002 | Huang et al. |
| 6,462,410 B1 | 10/2002 | Novotny et al. |
| 6,504,243 B1 | 1/2003 | Andric et al. |
| 6,624,816 B1 * | 9/2003 | Jones, Jr. ................. 345/503 |
| 6,687,320 B1 * | 2/2004 | Chiu et al. ................ 375/376 |
| 6,778,387 B2 | 8/2004 | Fairchild |
| 6,803,328 B2 | 10/2004 | McCullough |
| 6,832,410 B2 * | 12/2004 | Hegde .................... 165/80.3 |
| 6,886,625 B1 | 5/2005 | Sagal et al. |
| 6,891,724 B2 * | 5/2005 | De Lorenzo et al. .... 361/704 |
| 6,896,045 B2 | 5/2005 | Panek |

(Continued)

FOREIGN PATENT DOCUMENTS

JP      2000252667      9/2000

(Continued)

*Primary Examiner* — David Angwin
(74) *Attorney, Agent, or Firm* — Dorsey & Whitney LLP

(57) ABSTRACT

A method of manufacturing a thermal contact arrangement. The method including the operations of providing a thermal conductor and forming a first zone having a first roughness on a first portion of a first exterior surface of the thermal conductor. The method further including the operation of forming a second zone having a second roughness on a second portion of the first exterior surface of the thermal conductor. The second portion is unique from the first portion and formed from a part of the thermal contact arrangement other than the first portion and the second roughness is rougher than the first roughness.

18 Claims, 7 Drawing Sheets

U.S. PATENT DOCUMENTS

| | | | |
|---|---|---|---|
| 6,956,549 B2 * | 10/2005 | Naiki | 345/87 |
| 6,987,671 B2 * | 1/2006 | Houle | 361/704 |
| 7,006,353 B2 | 2/2006 | Matteson | |
| 7,045,885 B1 | 5/2006 | Chen et al. | |
| 7,085,135 B2 * | 8/2006 | Chu et al. | 361/704 |
| 7,125,433 B2 | 10/2006 | Garikipati et al. | |
| 7,148,125 B2 * | 12/2006 | Suzuki et al. | 438/459 |
| 7,149,909 B2 | 12/2006 | Cui et al. | |
| 7,190,585 B2 * | 3/2007 | Houle | 361/704 |
| 7,269,015 B2 * | 9/2007 | Hornung et al. | 361/704 |
| 7,401,243 B2 * | 7/2008 | Knepper et al. | 713/322 |
| 7,433,191 B2 | 10/2008 | Blanco, Jr. | |
| 7,440,281 B2 * | 10/2008 | Bailey et al. | 361/704 |
| 7,451,332 B2 * | 11/2008 | Culbert et al. | 713/320 |
| 7,454,316 B2 * | 11/2008 | Bose et al. | 702/186 |
| 7,730,336 B2 * | 6/2010 | Marinkovic et al. | 713/320 |
| 7,840,827 B2 * | 11/2010 | Dahan et al. | 713/324 |
| 7,866,941 B2 * | 1/2011 | Li et al. | 415/121.3 |
| 7,880,586 B2 * | 2/2011 | Fagrenius et al. | 340/7.6 |
| 7,882,369 B1 * | 2/2011 | Kelleher et al. | 713/300 |
| 2004/0238827 A1 | 12/2004 | Takayama et al. | |
| 2005/0077614 A1 * | 4/2005 | Chengalva et al. | 257/706 |
| 2006/0120051 A1 | 6/2006 | Macris et al. | |
| 2007/0076378 A1 * | 4/2007 | Blanco, Jr. | 361/719 |
| 2007/0177367 A1 * | 8/2007 | Bailey et al. | 361/808 |
| 2009/0284534 A1 * | 11/2009 | Hendry et al. | 345/501 |
| 2010/0103147 A1 * | 4/2010 | Sumpter | 345/204 |

FOREIGN PATENT DOCUMENTS

JP 200422928 1/2004

* cited by examiner

THERMAL CONTACT ARRANGEMENT

CROSS-REFERENCE TO RELATED APPLICATIONS

This application is a divisional patent application of U.S. patent application Ser. No. 11/241,061, filed Sep. 30, 2005 and entitled "Thermal Contact Arrangement," the disclosure of which is incorporated herein by reference in its entirety.

BACKGROUND

1. Technical Field

The present invention relates generally to a thermal contact arrangement between a processor and a heat sink, and more particularly to a processor thermal contact having at least a first and a second surface finish of differing smoothness.

2. Background of the Invention

Processors (also referred to as "computer processors" or "processor chips") are specialized electronic circuits providing computing functionality in a variety of modern electronics, such as computers or other computing devices, networking devices, and/or telecommunications devices. Processors ("chips") may be responsible for the overall operation of a computing, telecommunications, or network device (such as a central processing unit, router or switch), operation or coordination of a device's subsystem (such as a graphics or sound processor), particular operations (such as a math coprocessor), and so forth. During operation, processors generate heat as a result of their operation. The processor may be attached to a carrier such as a circuit board, as shown in the prior art view of FIG. 1.

Generally speaking, excessive temperature may disrupt a processor's operation or, in more severe cases, damage the processor. Accordingly and as shown in FIG. 1, a heat sink may be affixed to the processor in order to dissipate thermal energy generated by the processor. Similarly, heat sinks may be attached to other computing elements that generate heat in order to transfer heat away therefrom and safely dissipate the heat. A heat sink is one example of a thermal conductor, which may then dissipate the heat to the air, a liquid, or other similar cooling sub-system The interface between the processor and heat sink may be referred to as a "thermal joint." The rate of conductive heat transfer, Q, across the interface may be further refined to include the effects of contact resistance which then can be approximated by $$Q = \frac{KA(Tc - Ts)}{L}$$

where K is the thermal conductivity of an interface material (whether a dedicated thermal interface material discussed below, air, or another material), A is the heat transfer area, L is the interface thickness and Tc and Ts are the chip surface and heat sink temperatures. The thermal resistance of a thermal joint, Rc-s, is given by $$Rc-s = \frac{(Tc - Ts)}{Q}$$

and on rearrangement, $$Rc-s = \frac{L}{KA}$$

Thus, the thermal resistance of the thermal joint is directly proportional to the thermal joint thickness and inversely proportional to the thermal conductivity of the medium making up the thermal joint and to the size of the heat transfer area. Thermal resistance may be minimized by making the thermal joint as thin as possible, increasing thermal joint thermal conductivity by eliminating interstitial air and making certain that both surfaces are in intimate contact. The thermal resistance of the thermal contact arrangement (which, in one example, includes the thermal joint, processor or chip, and heat sink) may be generally expressed as the thermal resistance of the thermal joint plus the thermal interface resistances of the chip and heat sink:

$$Rtotal = \frac{L}{KA} + Rc-i + Rsi-c$$

where Rtotal is the total resistance of the thermal contact arrangement, Rc-i is the thermal resistance between the chip and interface material and Ri-s is the thermal resistance between the interface material and the heat sink.

FIG. 2 is a cross-sectional diagram taken along line 2-2 of FIG. 1. As shown in FIG. 2, a thermal interface material (TIM) may be sandwiched or placed between the processor and the heat sink. The TIM may facilitate or enhance heat transfer between the processor and heat sink, thus potentially reducing the temperature experienced by the processor and/or extending the processor life. The TIM essentially performs the functions of eliminating at least some interstitial air pockets and enhancing contact between the processor and heat sink. Further, a TIM typically has a high thermal conductivity K than air, and thus enhances the rate of conductive heat transfer Q.

TIMs, however, may suffer from migration over time. Put simply, some TIMs tend to move away from the thermal joint with time, flowing or otherwise migrating out from the heat transfer surface area of the processor and/or heat sink. As the TIM migrates, air pockets may form in the thermal joint, and rate of conductive heat transfer between processor and heat sink may drop. Thus, as time passes, the aforementioned problems may occur even though a TIM is initially used.

SUMMARY OF THE INVENTION

One embodiment of the present invention generally takes the form of a surface positioned on a heat sink adjacent to which a processor may be affixed. The processor may overlap or overlie a first segment of the surface, with a second portion of the surface surrounding the first portion. Accordingly, the second portion generally lies outside the footprint of the processor and further surrounds the processor's footprint. The combination of first and second portions (alternately called "first and second zones" or "first and second surfaces") may act to prohibit or at least reduce the migration of a thermal interface material positioned adjacent the first portion, as described in more detail below.

The first area or portion may have a generally smooth surface, while the second area or portion may have a surface rougher than the first area. That is, the first area may be finished to a specific smoothness while the second area may be finished to second particular smoothness that is generally less than the first area. It should be noted that the variations in surface finish between the first and second areas may be relatively small, on the order of microinches. It should also be noted that the variation in surface finish may not be readily detectable by human senses, such as sight or touch.

Another exemplary embodiment may take the form of a thermal contact arrangement, including a thermal conductor, a first zone having a first surface finish disposed on the thermal conductor, and a second zone having a second surface finish disposed on the thermal conductor, wherein the first surface finish and second surface finish are different. In certain embodiments, the first surface finish is smoother than the second surface finish. In yet further embodiments, the thermal conductor may be a heat sink. In still more embodiments, the thermal contact arrangement may include a processor operatively connected to the heat sink, wherein the first zone approximately corresponds to a footprint of the processor. A thermal interface material may be disposed within or adjacent to the first zone.

Yet another exemplary embodiment may take the form of a thermal contact arrangement including a carrier, a processor disposed on the carrier, a thermal interface material adjacent the processor, a heat sink thermally coupled to the processor by the thermal interface material. The heat sink may include a first surface finish defining a first zone, and a second surface finish defining a second zone, the second surface finish rougher than the first surface finish. In further embodiments, the thermal interface material may be a thermal grease, a thermal elastomer, an oxide-doped thermal grease, a metal-doped thermal grease, or a thermal adhesive. Alternative embodiments may use any of a number of similar materials as a TIM. In still other exemplary embodiments, a first side of the heat sink and a first side of the processor cooperate to form a thermal joint, the thermal interface material occupies at least a portion of the thermal joint, and the first zone and second zone are disposed on the first side of the heat sink. In some embodiments, the second zone at least partially surrounds the first zone.

Still another embodiment of the present invention may take the form of A method for manufacturing a thermal contact arrangement, including the operations of providing a thermal conductor, forming a first zone having a first roughness on a first exterior surface of the thermal conductor, and forming a second zone having a second roughness on the first exterior surface of the thermal conductor, wherein the second roughness is rougher than the first roughness.

DETAILED DESCRIPTION OF THE INVENTION

One embodiment of the present invention generally takes the form of a surface positioned on a heat sink adjacent to which a processor may be attached. The processor may overlap or overlie a first segment of the surface of the heat sink, with a second portion of the surface surrounding the first portion. Accordingly, the second portion generally lies outside the footprint of the processor and further surrounds the processor's footprint. A processor or chip's "footprint" refers to that portion of the heat sink (or other element) having generally the same shape and area as the adjacent surface of the processor.

The first area or portion may have a generally smooth surface, while the second area or portion may have a surface rougher than the first area. That is, the first area may be finished to a specific smoothness while the second area may be finished to second particular smoothness that is generally less than the first area. It should be noted that the variations in surface finish between the first and second areas may be relatively small, on the order of microinches. It should also be noted that the variation in surface finish may not be readily detectable by human senses, such as sight or touch.

Figure 1:
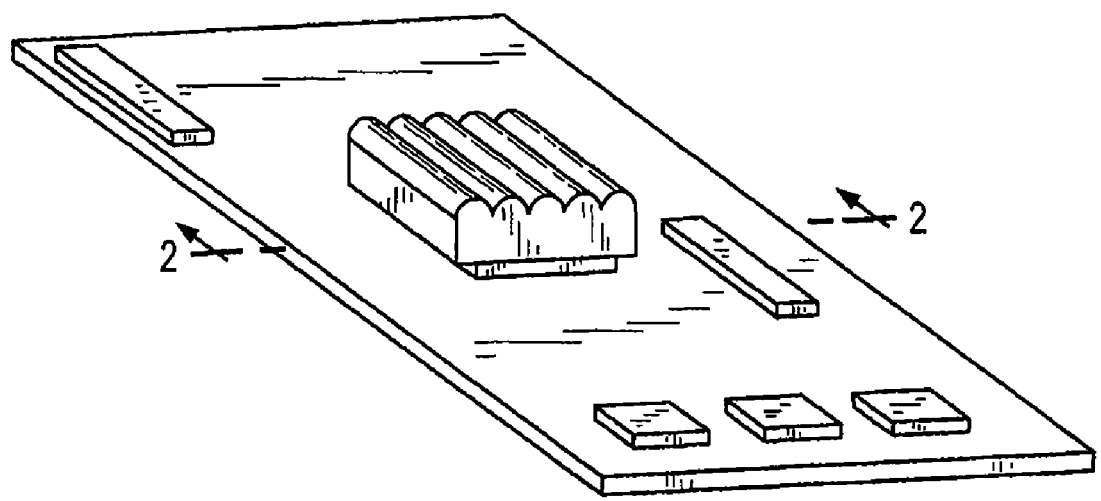
FIG. 1 depicts a prior-art thermal contact arrangement between a processor and a heat sink.
Figure 2:
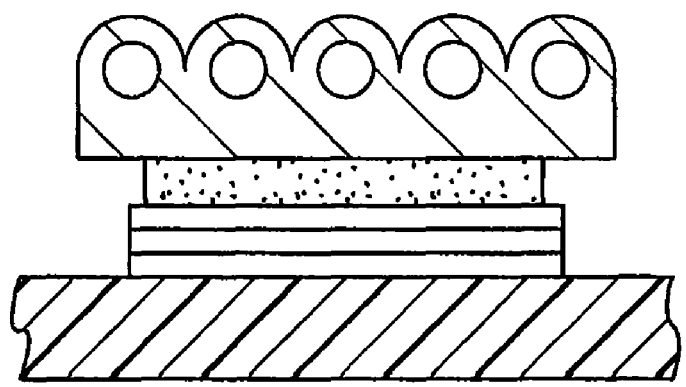
FIG. 2 depicts a cross-sectional view of the thermal contact arrangement of FIG. 1, taken along line 2-2 of FIG. 1.
Figure 3:
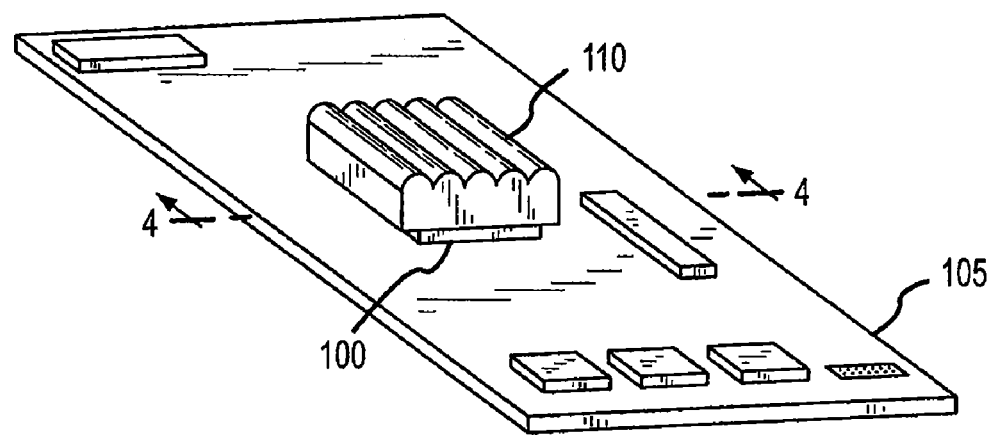
FIG. 3 depicts an exemplary processor (or other chip) mounted on an exemplary carrier, in accordance with a first embodiment of the present invention.

FIG. 3 depicts an exemplary processor (or other chip) mounted on an exemplary carrier, such as a graphics card, sound board, motherboard, or other computer, network, or telephony hardware, board or card. The exact function of the processor and/or board may vary. For example, the processor may be a dedicated graphics processor, a central processing unit, a memory processor, and so forth. Accordingly, it should be understood that various embodiments of the present invention may be used in any number of exemplary environments, networks, telephony systems or computer systems, and implemented on a wide variety of computer, network or telephony hardware (for example, the aforementioned boards or cards) and with any of a number of different types of processors. As yet another example, a smart card having an internal processor may employ an embodiment of the present invention, as may any other portable processing device. It should be understood that exemplary operating environments in which exemplary embodiments of the present invention may operate or be found include personal computers, network servers, microcomputers, minicomputers, desktop computers, notebook computers, mobile telephones, personal computing or scheduling devices, personal communication devices, switches, routers, tablet computing devices, digital entertainment devices such as MPEG Layer-3 (MP3) players or cameras, and so forth.

Returning to FIG. 3, a processor 100 is affixed to a carrier 105. The processor 100 may be attached to the carrier 105 by one or more prongs or a socket extending through one or more vias and into the material of the carrier, solder, an adhesive, or by any other means known in the art. The carrier may be, for example, a printed circuit board (PCB) or other type of circuit board, integrated circuit or system-on-chip design, breadboard, stripboard, or other electrical component or appropriate material as known to those of ordinary skill in the art.

Figure 4:
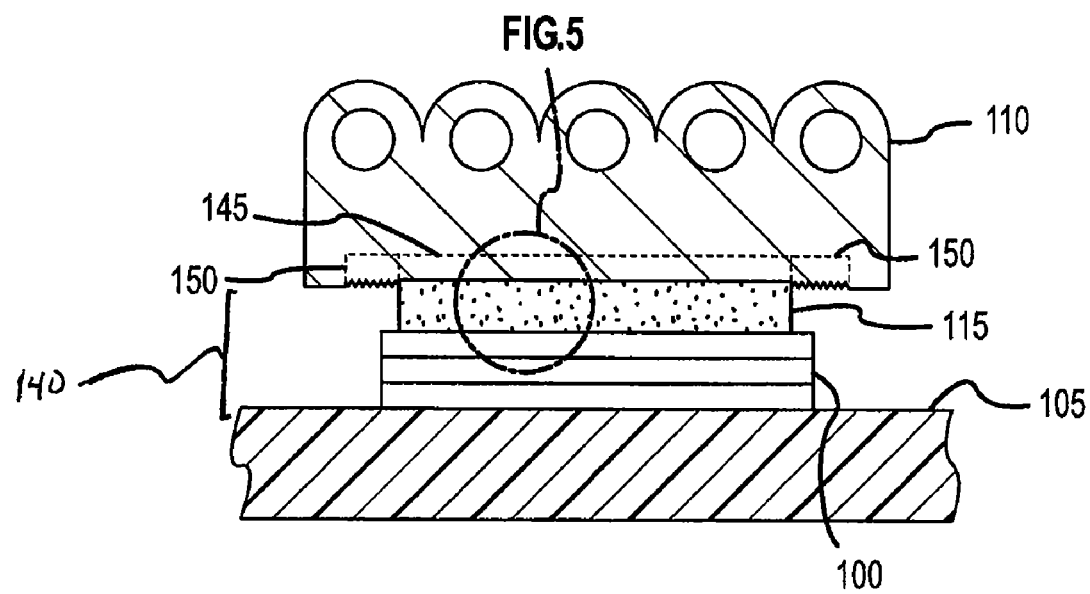
FIG. 4 depicts a cross-sectional view of the processor and carrier of FIG. 3, taken along line 3-3 of FIG. 4.

As shown in the cross-sectional view of FIG. 4, taken along line 4-4 of FIG. 3, disposed above the processor is a heat sink 110. The heat sink 110 generally overlies the processor 100 or chip. The heat sink generally is a thermally conductive element, such as a metal, conducting heat away from the processor 100 and dissipating it to an environment or thermal mass capable of receiving and/or dissipating the heat.

As also shown in FIG. 4, in the present embodiment the heat sink 110 is not directly touching or directly adjacent to the processor 100 along the entirety of the processor's or heat sink's length. (In alternative embodiments, some or all of the heat sink 110 may contact the processor 100). Rather, a thermal interface material (TIM) 115 may be placed between the heat sink 110 and the processor 100. The TIM 115 may be generally described as a material increasing thermal conductivity between the processor and heat sink. The TIM 115 accordingly facilitates heat flow between these two elements at the thermal joint 140 therebetween.

Figure 5:
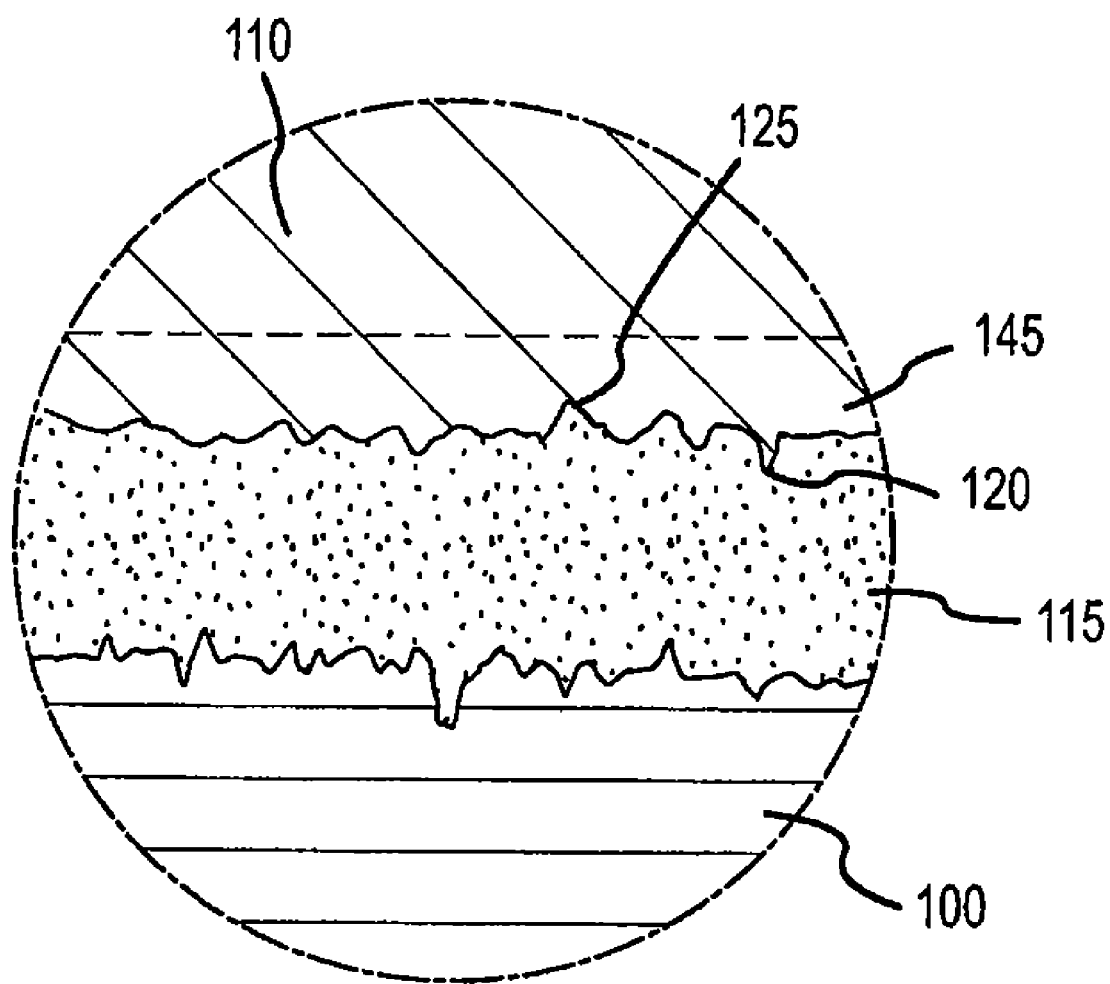
FIG. 5 is an expanded view of a portion of the cross-sectional view of FIG. 4.

Typically, both the processor 100 and heat sink 110 have at least some surface irregularities, as shown to better effect in the expanded cross-sectional view of FIG. 5. In many cases, these surface irregularities are invisible to the human eye and/or undetectable to human touch. For example, the surfaces of both the processor 100 and heat sink 110 may have microscopic hills 120 and/or valleys 125. These irregularities may be measured in microinches, depending on the finish and type of processor 100 and/or heat sink 110 employed. Similarly, either the processor 100 may have more macroscopic changes in surface. One or both of the processor and heat sink may be, for example, concave, convex twisted or otherwise non-planar along at least a portion of their facing surfaces. Thus, the processor and heat sink may abut at certain points along their surfaces, while being spaced apart at other points. The TIM 115 may at least partially fill in such valleys 125 and/or macroscopic features, thus replacing air that may otherwise reside between the processor 100 and heat sink 110. The TIM 115 is typically a better heat conductor than air.

One or more of a variety of TIMs 115 may be placed between the processor 100 and heat sink 110 to facilitate heat transfer therebetween. For example, the TIM 115 may be a thermal grease (which may be silicone based), thermally conductive compound, thermally conductive elastomer (such as a pad), thermal grease with an oxide or metal filler, adhesive tape, and so forth. As a general rule, the TIMs mentioned herein may be ranked by thermal conductivity K from lowest conductivity to highest conductivity, as follows: thermal grease; elastomer or pad; thermal grease with an oxide filler; and thermal grease with a metal filler or metallic materials (such as solders). It should be noted this ranking is a general overview; the exact composition of a given TIM 115 may make it more or less conductive than the neighboring TIM on the scale given. Further, thermal greases and/or compounds typically have a lower interface resistance (that is, they spread more easily), but may be less convenient to apply than a thermal adhesive pad, for example.

A TIM 115 may migrate with time. When a TIM 115 migrates, it spreads or moves away from the interface or thermal joint 140 at which it was originally applied. TIM migration may lead to the formation of air pockets within the thermal joint 140, and thus lowered thermal conductivity between the processor 100 and heat sink 110. This, in turn, may lead to higher processor operating temperatures and cause errors during operation of the processor and possibly eventual damage to the processor.

Figure 6:
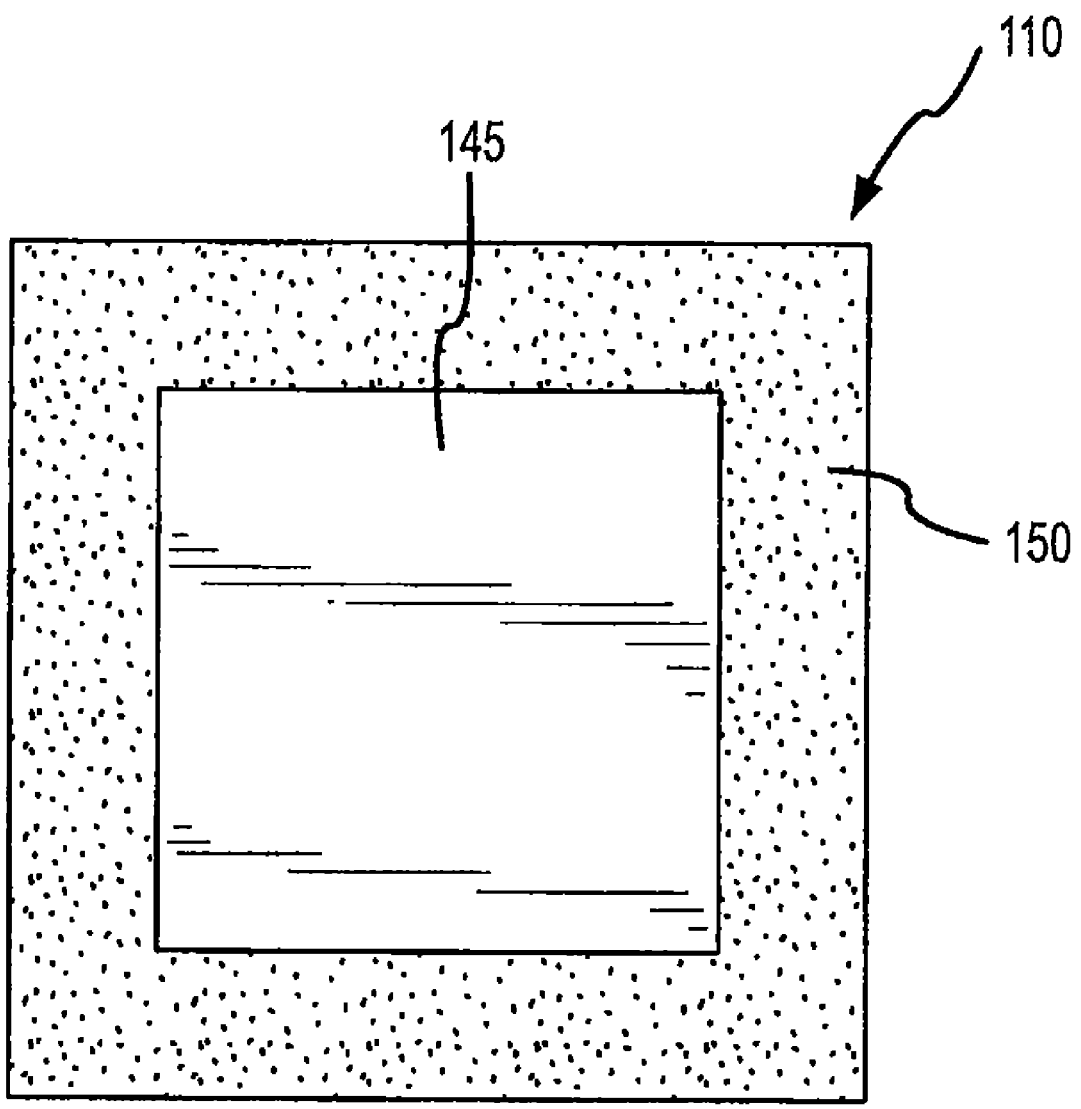
FIG. 6 depicts an exemplary first zone and exemplary second zone formed on the surface of a heat sink in a first pattern, in accordance with the first embodiment of the present invention.

To minimize, resist, or delay such migration, the surface of the heat sink 110 facing the processor 100 may define two distinct zones or areas, each with a separate surface finish. FIGS. 4 and 6 depict an exemplary heat sink 110 surface defining a first zone 145 and a second zone 150. As shown in FIGS. 4 and 6, the first zone 145 generally corresponds to the footprint (surface area) of the processor 100, and forms one side of the thermal joint 140. The first zone 145 may extend slightly beyond the footprint of the processor 100 in certain embodiments. In yet other embodiments, the first zone 145 may be slightly smaller than the processor's footprint. The second zone 150 generally surrounds the first zone 145. The width of the second zone 150 may vary in different embodiments. In some embodiments, for example, the second zone 150 may extend from the outer edge of the first zone 145 to the heat sink edge. In still other embodiments, the second zone 150 may terminate before the heat sink edge is reached. The first zone and second zone may be contiguous, such that the border of the first zone abuts the border of the second zone (see FIG. 4), or a gap or space may exist between zones.

In yet other embodiments, the second zone 150 may extend into the footprint of the processor 100 on the heat sink 110, in some cases by a substantial amount.

As mentioned above, the first and second zones 145, 150 typically have different surface finishes, as shown in FIG. 6. FIG. 6 is generally a plan view looking upward at the base of the heat sink 110. In an exemplary embodiment, the first zone's surface finish is selected to facilitate heat transfer between the processor 100, TIM 115, and heat sink 110, while the second zone's surface finish is selected to resist or delay TIM migration.

As one example of acceptable surface finishes relative to one another, the first zone 145 may have a relatively smooth surface finish and the second zone 150 may have a rougher finish. The relatively smooth surface finish of the first zone 145 may minimize or reduce hills 120 and/or valleys 125 formed on the heat sink 110. This, in turn, enhances heat transfer from the processor 100 through the TIM 115, since it maximizes the contiguous surfaces of the thermal joint 140.

Continuing the example and by contrast, the second zone 150 may have a surface finish relatively rougher than that of the first zone 145. This rougher surface finish may act to minimize or otherwise reduce spreading (i.e., migration) of the TIM 115 with time. More particularly, the rougher surface finish of the second zone 150 may create or enhance a surface tension with the material of the TIM 115, thus confining the TIM to the smoother surface of the first zone 145. The rougher the surface finish of the second zone, the greater the surface tension with the TIM material. Further, the greater the surface tension between the second zone and TIM, the more the TIM may resist migration. Certain TIMs may be more affected by this surface tension and thus resist migration more effectively. For example, a thermal grease may experience greater surface tension with the rough surface of the second zone 150 than would a pad or other elastomer.

In an exemplary embodiment of the present invention, the first zone 145 may have a surface finish on the order of four to 32 microinches root mean square (RMS), while the second zone 150 may have a surface finish on the order of 63 to 250 microinches root mean square. It should be understood that these ranges are exemplary, rather than limiting. Alternative embodiments may vary the actual surface finishes of either or both of the first and second zones 145, 150 from these ranges without departing from the spirit or scope of the invention.

Yet other embodiments of the present invention may define a third zone, fourth zone, or even more zones having varying surface finishes on the exterior of the heat sink. For example, in some embodiments a third zone may be formed about the second zone 150 and provided with a surface finish rougher than that of the second zone. This may provide still greater surface tension with the TIM 115 in the event the TIM migrates from adjacent the first zone 145 to a position adjacent the second zone 150.

In still another embodiment, a third zone may surround the second zone 150 as described above, but have a smoother surface finish than the second zone. A fourth zone may surround the second zone and have a surface finish rougher than that of the third zone (for example, approximately equal to the roughness of the second zone's surface finish). In this manner, the third zone may act as a trough to capture any TIM 115 that moves or migrates past the second zone 150. The combination of the fourth zone's and second zone's surface finish may establish a surface tension on either side of TIM migrating to (or abutting) the third zone.

The second zone 150 may be subdivided into a number of smaller "sub-zones" of varying surface finish. This may permit the second zone 150 to provide greater surface tension with the TIM 115 at certain areas of the heat sink (for example, those areas prone to migration of the TIM), and lesser surface tension with the TIM at other areas. Further, by providing varying surface finishes across the second zone 150, the TIM 115 may be encouraged to migrate along a particular path. For example, the TIM may be encouraged to migrate to a collection point, or to a point easily visible to a casual observer. In this manner, migration of the TIM 115 may be more easily seen and the TIM may be replaced or replenished accordingly.

Figure 7:
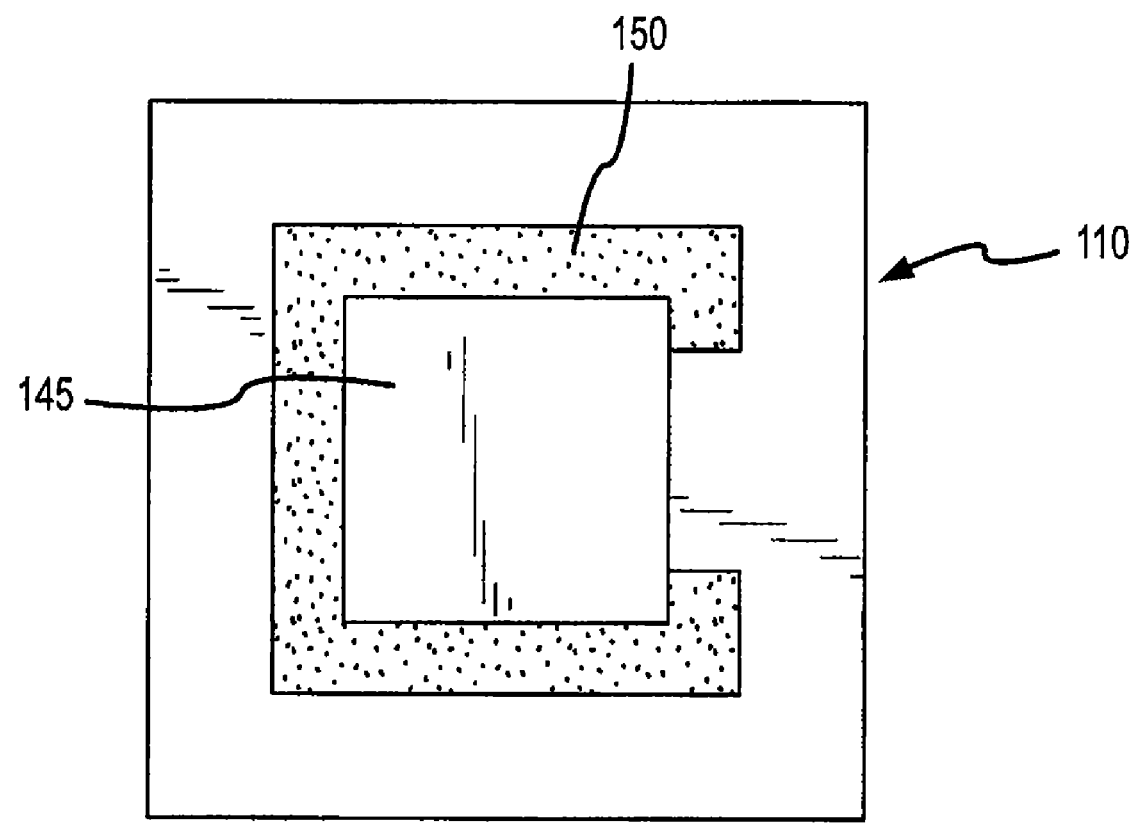
FIG. 7 depicts an exemplary first zone and exemplary second zone formed on the surface of a heat sink in a second pattern, in accordance with a second embodiment of the present invention.

The TIM may be similarly encouraged to migrate in a particular manner by forming the second zone 150 into a particular pattern, as shown in FIG. 7. The second zone 150 may extend in a C-shape, U-shape or other shape, leaving an exit path 155 along which the TIM 115 may migrate. The exit path 155 may terminate in a collection reservoir 160, which may be visible when the processor 100, carrier 105, and/or heat sink 110 are installed in an operating environment. Further, the second zone 150 (or another zone with a relatively rough surface finish) may surround the collection reservoir 160 to prevent the TIM 115 from migrating out of the reservoir.

Figure 8:
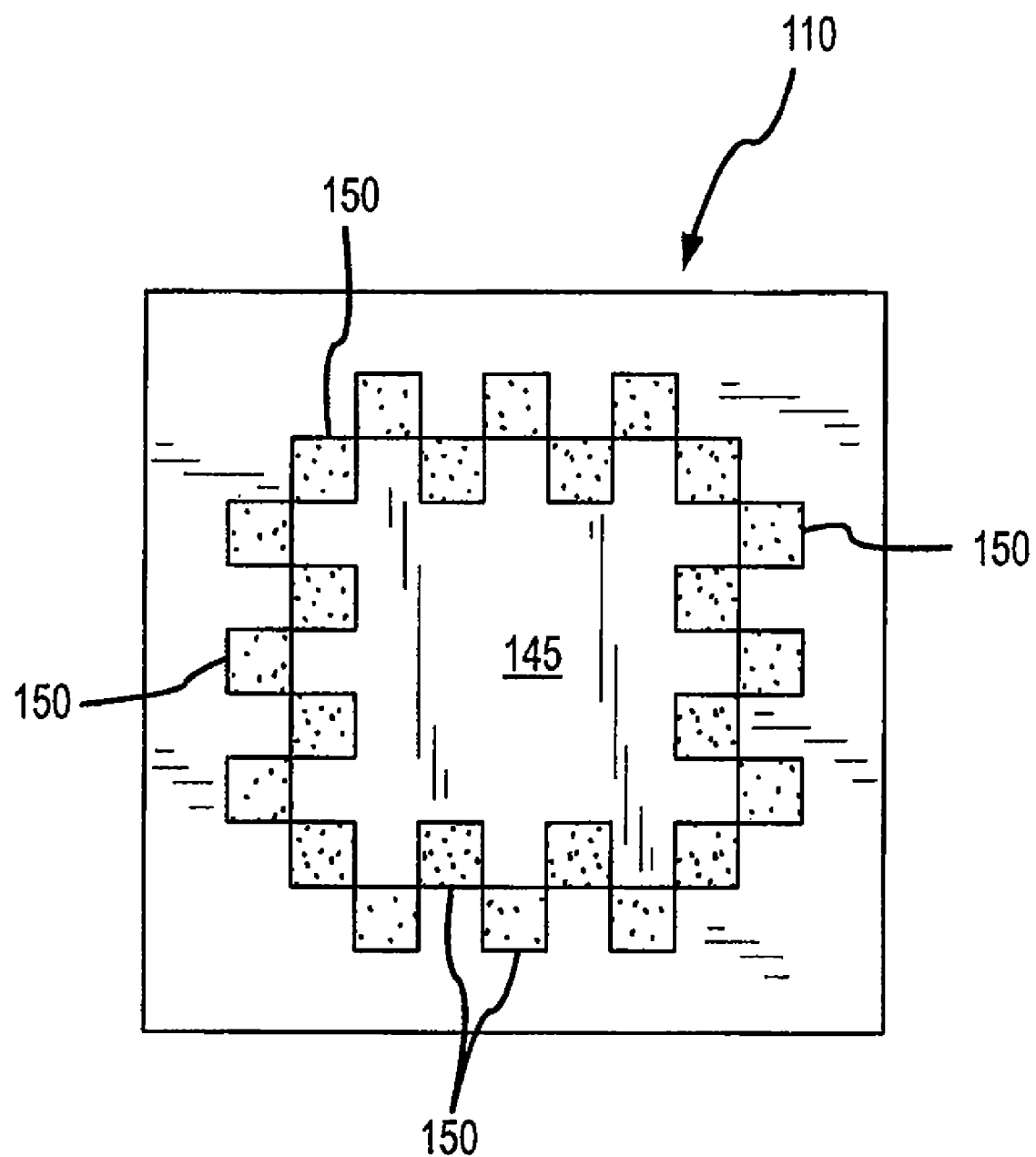
FIG. 8 depicts an exemplary first zone and exemplary second zone formed on the surface of a heat sink in a third pattern, in accordance with a third embodiment of the present invention.

In still further embodiments, the second zone 150 may be formed in one or more of a variety of unique patterns. The width of any portion of the second zone 150 may be varied, the second zone may be formed in a checkerboard pattern (as shown in FIG. 8, where shading indicates roughened surfaces of the second zone 150), and so forth. The exact configuration of the second zone 150, as well as that of the first zone 145, may vary depending on the size and/or shape of any of the processor 100, heat sink 110, and/or carrier 105, as well as the operating environment of any of the foregoing.

The various surface finishes and zones 145, 150 described herein may be created or enhanced according to a variety of manufacturing processes. For example, the first zone 145 may be formed by polishing, grinding, chemically smoothing or otherwise smoothing an exterior surface of the heat sink 110, while the second zone 150 may be formed from an unpolished or untreated exterior surface of the heat sink. Conversely, the first zone 145 may be formed on an untreated portion of the heat sink, while the second zone 150 may be formed by etching, eroding, scuffing or machining another portion of the sink 110. Further, both zones may be formed through chemical or mechanical treatments. For example, the first zone may be a polished segment of the heat sink 110 and the second zone may be a chemically roughened segment.

The foregoing embodiments have generally been described with respect to a single processor 100 and single heat sink 110. Alternative embodiments may employ multiple heat sinks with a single processor, or multiple processors with a single heat sink. For example, one heat sink 110 might cover two or more processors 100. A first zone 145 may be formed about both processors and a second zone 150 about the first zone, in a manner analogous to that described above. In yet another embodiment, a first zone 145 may be formed around each processor, and a second zone 150 around each first zone (or a single second zone around both first zones).

Figure 9:
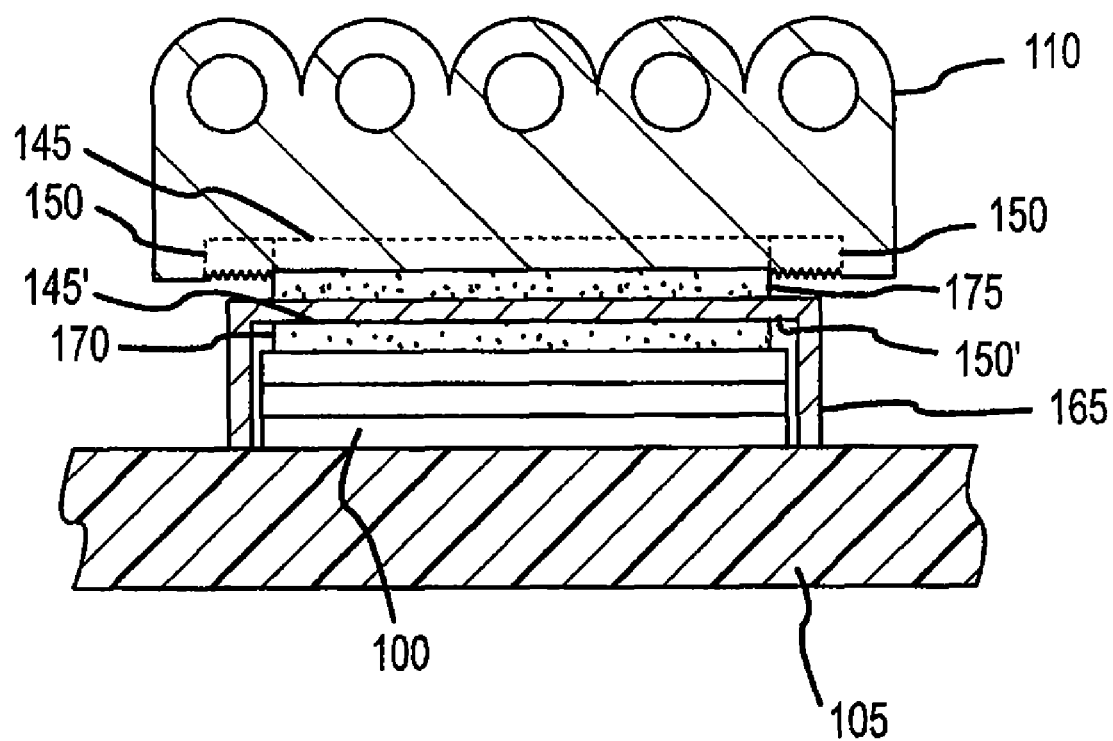
FIG. 9 depicts a cross-sectional view of a thermal contact arrangement similar to that of FIG. 4, but including a lid.

Still other embodiments of the present invention may be used with a so-called "lidded" chip 100, as shown in cross-section in FIG. 9. The cross-section of FIG. 9 is similar to that of FIG. 4, but shows a lid 165 enclosing the processor 100. The lid 165 may be connected or affixed to the carrier 105. A first TIM 170 generally conducts heat from the processor to the lid. A heat sink 110 may be placed above the lid 165, with a second TIM 175 conducting heat from the lid to the sink. The two TIMs 170, 175 may be of the same or differing materials.

A first zone 145 and second zone 150 may be formed in the heat sink surface as described above. Here, however, the first and second zones may cooperate to reduce migration of the second TIM 175. Similarly, a first lid zone 145' and second lid zone 150' may be formed on an exterior surface of the lid adjacent the first TIM 170. The first and second lid zones 145', 150' may cooperate as described herein to reduce migration of the first TIM 170. Accordingly, each TIM 170, 175 may have a unique set of first and second zones.

The present invention has been generally described with the various surface finishes and/or zones (such as the first and second zones) being formed on or otherwise associated with a surface of the heat sink. It should be understood, however, that such surface finishes and/or zones may alternately be formed on a surface of a chip or processor facing or adjacent to a TIM. In still other embodiments, the various surfaces and/or zones described herein may be formed on both a chip surface and heat sink surface.

The present invention and its various embodiments have been described herein with respect to particular apparatuses and methods. However, those of ordinary skill in the art will realize that alternative embodiments of the present invention may be formed by rearranging, adding or subtracting certain elements, or by making other changes to the embodiments described herein. Accordingly, the various embodiments described herein are intended to be exemplary and not limiting. The proper scope of the invention is defined by the appended claims.

The invention claimed is:

1. A method for manufacturing a thermal contact arrangement, comprising the operations:
   providing a thermal conductor;
   forming a first zone of the thermal contact arrangement having a first roughness on a first portion of a first exterior surface of the thermal conductor; and
   forming a second zone of the thermal contact arrangement having a second roughness on a second portion of the first exterior surface of the thermal conductor, the second portion unique from, and formed from a part of the thermal contact arrangement other than the first portion; wherein
   the second roughness is rougher than the first roughness.

2. The method of claim 1, wherein the operation of forming a first zone having a first roughness on a first exterior surface of the thermal conductor comprises polishing a first area of the first exterior surface to a desired roughness to form the first zone.

3. The method of claim 2, wherein the operation of forming a second zone having a second roughness on the first exterior surface of the thermal conductor comprises chemically treating a second area of the first exterior surface to a desired roughness to form the second zone.

4. The method of claim 3, further comprising:
providing a carrier;
attaching a processor to the carrier;
positioning the thermal conductor to form, in concert with the processor, a thermal joint; and
placing a thermal interface material in the thermal joint.

5. The method of claim 4, wherein the operation of positioning the thermal conductor to form, in concert with the processor, a thermal joint, comprises:
positioning the first zone adjacent a side of the processor.

6. The method of claim 1, wherein the operation of forming a second zone having a second roughness on the first exterior surface of the thermal conductor comprises forming the second zone on the first exterior surface of the thermal conductor to at least partially surround the first zone.

7. The method of claim 6, wherein the operation of forming a second zone having a second roughness on the first exterior surface of the thermal conductor comprises forming the second zone on the first exterior surface of the thermal conductor to at least partially surround the first zone such that the first zone and the second zone are contiguous.

8. The method of claim 6, wherein the operation of forming a second zone having a second roughness on the first exterior surface of the thermal conductor comprises forming the second zone on the first exterior surface of the thermal conductor to at least partially surround the first zone such that a gap is defined between the first zone and the second zone.

9. The method of claim 1, wherein the operation of forming a first zone having a first roughness on a first exterior surface of the thermal conductor comprises at least one of grinding a first area of the first exterior surface to a desired roughness to form the first zone and chemically treating the first area of the first exterior surface to a desired roughness to form the first zone.

10. The method of claim 9, wherein the operation of forming a second zone having a second roughness on the first exterior surface of the thermal conductor comprises forming the second zone on an untreated area of the first exterior surface.

11. The method of claim 1, wherein the operation of forming a second zone having a second roughness on the first exterior surface of the thermal conductor comprises at least one of chemically treating a second area of the first exterior surface to a desired roughness to form the second zone, etching the second area of the first exterior surface to a desired roughness to form the second zone, eroding the second area of the first exterior surface to a desired roughness to form the second zone, scuffing the second area of the first exterior surface to a desired roughness to form the second zone, and machining the second area of the first exterior surface to a desired roughness to form the second zone.

12. The method of claim 11, wherein the operation of forming a first zone having a first roughness on a first exterior surface of the thermal conductor comprises forming the first zone on an untreated area of the first exterior surface.

13. The method of claim 1, further comprising:
forming a third zone having a third roughness on a first exterior surface of the thermal conductor.

14. The method of claim 13, wherein the third roughness is rougher than the second roughness.

15. The method of claim 13, further comprising:
forming a fourth zone having a fourth roughness on a first exterior surface of the thermal conductor, wherein the fourth roughness is rougher than the third roughness and the second roughness is rougher than the third roughness.

16. The method of claim 15, wherein the fourth roughness is approximately equal to the second roughness.

17. The method of claim 1, further comprising:
providing a lid;
forming a third zone having a third roughness on a first exterior surface of the lid;
forming a fourth zone having a fourth roughness on the first exterior surface of the lid, wherein the fourth roughness is rougher than the third roughness;
coupling the first exterior surface of the lid to a processor utilizing a first thermal interface material; and
coupling the first exterior surface of the thermal conductor to a second exterior surface of the lid utilizing a second thermal interface material.

18. The method of claim 1, further comprising:
providing a processor;
forming a third zone having a third roughness on a first exterior surface of the processor;
forming a fourth zone having a fourth roughness on the first exterior surface of the processor, wherein the fourth roughness is rougher than the third roughness; and
coupling the first exterior surface of the processor to the first exterior surface of the thermal conductor utilizing a first thermal interface material.

* * * * *